United States Patent [19]

Gaertner et al.

[11] 4,441,037
[45] Apr. 3, 1984

[54] INTERNALLY GATED VARIABLE PULSEWIDTH CLOCK GENERATOR

[75] Inventors: Gregory E. Gaertner; Ta-Ming Wu, both of San Diego, Calif.

[73] Assignee: Burroughs Corporation, Detroit, Mich.

[21] Appl. No.: 218,479

[22] Filed: Dec. 22, 1980

[51] Int. Cl.³ .................. H03K 5/13; H03K 17/687
[52] U.S. Cl. ................................ 307/265; 367/269; 367/582; 367/228; 328/72
[58] Field of Search .............. 307/265, 66, 67, 269, 307/480, 228, 582; 328/63, 72, 111, 112

[56] References Cited
U.S. PATENT DOCUMENTS 3,946,322  3/1976  Katz ................................ 307/265
4,035,663  7/1977  Stodala .......................... 307/269
4,272,690  6/1981  Riney et al. .................... 307/265
4,309,712  1/1982  Iwakura ......................... 307/265

Primary Examiner—Stanley D. Miller
Assistant Examiner—B. P. Davis
Attorney, Agent, or Firm—Mervyn L. Young; J. Ronald Richbourg; Kevin R. Peterson

[57] ABSTRACT

This disclosure relates to a variable pulsewidth gated clock generator which is able to provide output clock signals with the same rise rate as an external driving clock with the output signal being varied in duration according to logic conditions within the integrated circuit. The circuit of the present invention as disclosed includes a latch which is set by the first phase of a two-phase clock to set the internal logic of the circuit to generate a large output signal during the second phase of the two-phase clock.

3 Claims, 10 Drawing Figures

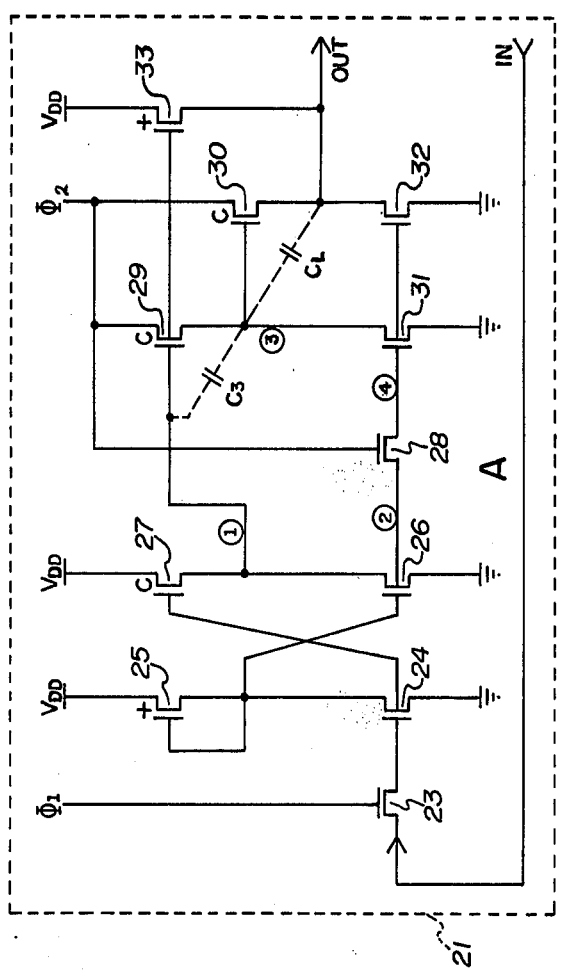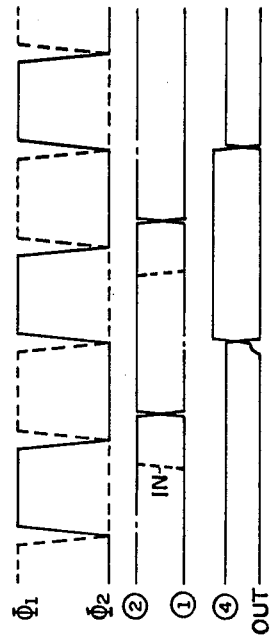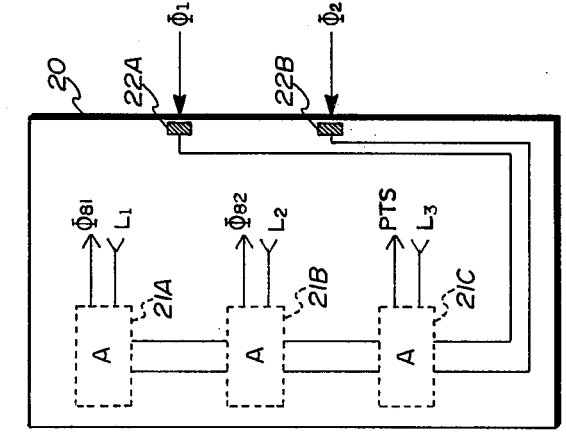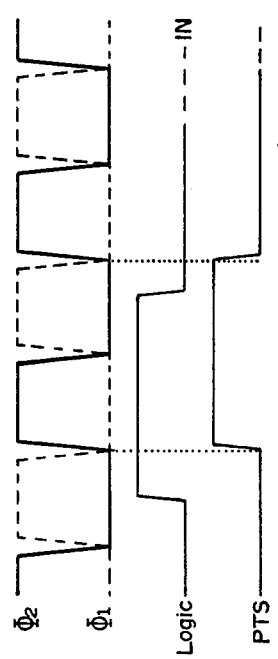

INTERNALLY GATED VARIABLE PULSEWIDTH CLOCK GENERATOR

BACKGROUND OF THE INVENTION

1. Field of the Invention

This invention relates to a variable pulsewidth gated clock generator and more particularly to such a generator for the provision of timing signals in a digital display unit.

2. Description of the Prior Art

In order to reduce the manufacturing costs of the circuitry for a digital display unit, it is desirable to achieve as many functions on a single integrated circuit chip as permissible, either by increasing the packing density of the gates in the chip or by novel circuit designs and architecture creation. This in turn leads to wider use of the digital display units to in turn accommodate more applications for information processing systems.

Such digital display units may be custom made or may be formed of conventional commercial television sets. In either case, the information displayed is usually of the nature of characters formed of dot matrix where the display unit employs a raster scan mode. Each horizontal line is divided into a number of discrete points or areas called picture elements (PELS) or pixels. A fraction of such picture elements per line is not employed for information display but is that portion of the scan time required for horizontal retrace and synchronization of the horizontal oscillator.

As the display screen is scanned, the dot matrix characters are formed by character generation circuits that control the modulation of the electron beam (in the case of CRT displays), individual circuits of which are selected by character codes that are stored in the memory. This code store can be a shift register with exactly the same number of cells as there are character positions on the display screen, or it may be a random access memory.

In some display units, 25 to 30 complete scans of all the lines making up the display are made per second. Thus, each portion of a character being displayed is on display 25 to 30 times a second for a brief period and this can cause an apparent flickering. The flickering problem is normally solved by refreshing or redrawing all the lines in the display in two consecutive interlaced scans. A "half-scan" is redrawn or refreshed in half the time. Because of the 2:1 interlace between the two half-scans, if a horizontal line is drawn in one half-scan and is adjacent to a line drawn in the next half-scan, the two form a line on the display screen with reduced flicker because, in essence, it is written twice as often. Applying this knowledge, 6×8 dot matrix character can be displayed on a 12×16 dot matrix, by displaying each dot in the 6×8 matrix four times. This reduces flicker considerably, as the character now seems to be written 50 to 60 times a second, instead of 25 to 30 times.

In order to supply such elements of information to the video output circuit to create a complete display in a commercial video monitor, it is necessary that the respective registers and gates in the video output circuit and the buffer circuit be driven by a very fast clock, of the order of magnitude of 12 megahertz or higher. Since the respective video output circuits and buffer circuits are implemented in integrated circuit silicon chips, the respective circuits are driven by an external clock of appropriate frequency. However, many of the clock signals required to drive the respective circuits may not be of the same time duration as are the high speed external clock signals. Therefore, it is desirable to be able to provide a clock generator that is driven by an external clock but can nevertheless vary the output clock signal in a manner determined by logic internal to the integrated circuit chip. It is, therefore, an object of the present invention to provide an improved gated clock generator for employment with the video output circuit of a digital display.

It is still another object of the present invention to provide a gated clock generator, the output pulsewidth of which may be varied as required.

It is still another object of the present invention to provide a gated clock generator which can operate at the frequency of an external clock and yet provide enough power to drive the various circuits within the integrated chips of which the video output circuit is formed.

SUMMARY OF THE INVENTION

In order to achieve the above-identified objects, the present invention is directed toward a gated clock generator for a video output circuit which is driven by a two-phase clock. The gated circuit includes a latch which is set by the first phase of the two-phase clock as well as the logic to turn on a bootstrapped output driver to generate a large output signal during the second phase of the two-phase clock. Furthermore, the latch is adapted to remain set as long as there is an input signal so that the generated output signal will be of the same duration of time as the input signal irrespective of the two phases of the two-phase clock.

BRIEF DESCRIPTION OF THE DRAWINGS

The above and other objects, advantages and features of the present invention will become more readily apparent in review of the following specification when taken in conjunction with the drawings wherein:

FIG. 5 is a diagram illustrating the arrangement of the clock generating of the present invention as implemented in an integrated circuit chip;

FIG. 6 is a schematic diagram of the clock generator of the present invention; and FIGS. 7 and 8 are waveforms representing the operation of the clock generator of the present invention.

GENERAL DESCRIPTION OF THE INVENTION

Figure 1:
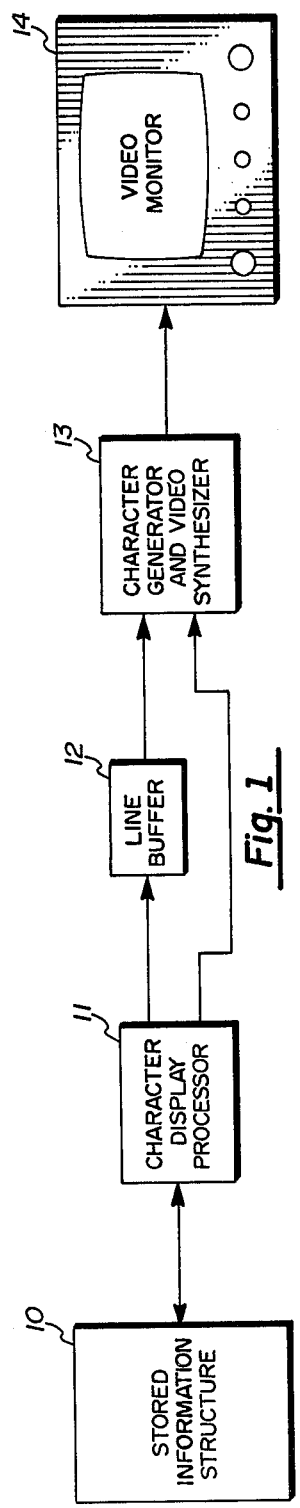
FIG. 1 is a representation of a display system employing the present invention.

A digital display system of the type employing the present invention is illustrated in FIG. 1. As shown therein, stored information structures are fetched from information storage 10 by character display processor 11 which controls the communication between storage 10 and the video output circuit employing the present invention. Character codes from the display processor 11 are received by line buffer 12 for sequential presentation to the video output circuit 13. As indicated in FIG. 1, video output circuit 13 includes both the character generation circuitry and the video synthesization circuitry. The system of the present invention is adapted to provide video signals to a commercial video monitor 14.

The picture on the display monitor 14 is refreshed or redrawn a number of times per second, 25 to 30 times per second in the system in which the present system resides. For this reason, there has to be a storage for the information to be displayed during each scan of the display. Line buffer 12 of FIG. 1 provides this capability. The display area of the television screen can be divided into a coordinated system which, in the system being described has 640 picture elements on a horizontal line and 480 lines in a picture. As will be more fully described below, the timing sequence provides for an additional 140 picture elements to accommodate the retrace portion of the scan cycle. If a chosen character set were to contain, for example, characters 8 picture elements wide and 16 lines high, the character position counter would divide the screen into 80 character positions horizontally and 30 character lines vertically for an $80 \times 30 = 2,400$ characters to be displayed.

Figure 2A:
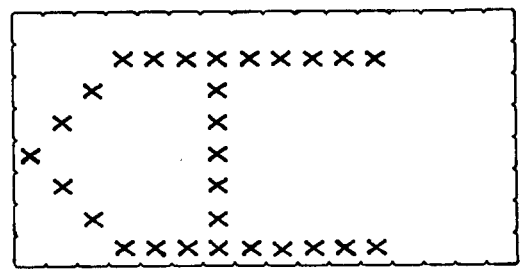
FIGS. 2A–C illustrate characters that can be displayed by the system of FIG. 1.

The character generator of the present invention generates the signals for each character dot-matrix pattern. For a brief explanation of this pattern, reference is now made to FIG. 2A which illustrates as an example, the dot-matrix pattern for the letter "A." The dot matrix, in this example, is an area of 16 rows of 8 picture elements each. The character "A" is defined by those areas marked by "X's" which represent the picture element on the display screen that will be activated during the character generation or appear as light dots on the display screen with the blank areas in FIG. 2A representing dark dots or inactivated areas. The character created on the display screen is represented by the dark and light areas according to the character pattern.

Figure 2B:
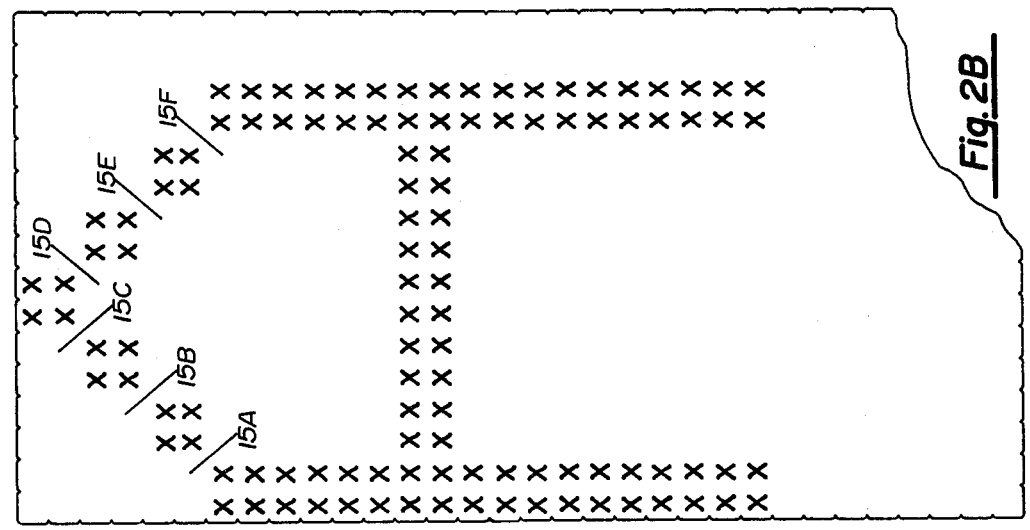
Figure 2C:
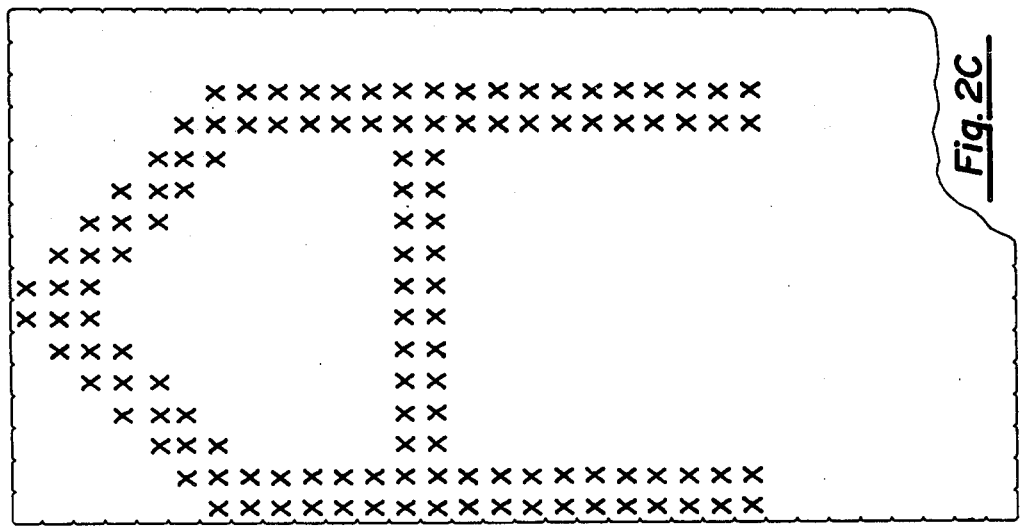

As was indicated above, it is common to employ an interlaced scan in a commercial television display to reduce the flickering of that information as it is seen by the viewer. To this end, the individual character information generated by the character generator circuitry is displayed four times. Thus, an $8 \times 16$ character such as illustrated in FIG. 2A becomes a $16 \times 32$ character dot matrix as illustrated in FIG. 2B. FIG. 2B appears to be ragged because of the lack of informational bits as illustrated in FIG. 2B or they are denoted by diagonal lines 15A-F. Because of the display of each informational bit four times, this results in the exclusion of "included" corners. As described in the Greer et al. application Ser. No. 178,494, filed Aug. 15, 1980, and in the Seitz et al. U.S. Pat. No. 4,119,954, circuitry can be provided to supply informational bits to adjacent areas whenever "included" corners are to occur. This results in the display of a character as illustrated in FIG. 2C.

The video output circuit employing the present invention can generate four character sizes depending upon two status bits, high and wide, of the status code which precedes the character code and specifies the mode in which the character is to be displayed. If both of these bits are O, a normal-sized character with 8 columns and 16 rows is generated.

A row address is also provided to the video output circuitry to specify the start of each horizontal line. The row address is used with the status bits for highlights: superscript, subscript, and high, to determine which horizontal row of the character font is output for the present scan line. Other highlights can be specified by appropriate bits in the status code. The Bright and Reverse bits control the intensity levels assigned to the foreground and the background shades. These four combinations include various combinations of gray, black, and white for both the foreground and the background. When the Underline status bit is set, the two scan lines below the character are set to the foreground shade for that character. The Blank or Invisible bit causes the entire character, including the Underline, to be displayed as a background shade. When the Secure bit is set, all pixels within the character area are displayed as a foreground shade. This highlight has no effect outside of the character area, or if the Blank bit is enabled. Finally, the setting of the cursor bit reverses all pixels within the character area, i.e., pixels of the background shade are displayed as foreground shade and vice versa.

Figure 3:
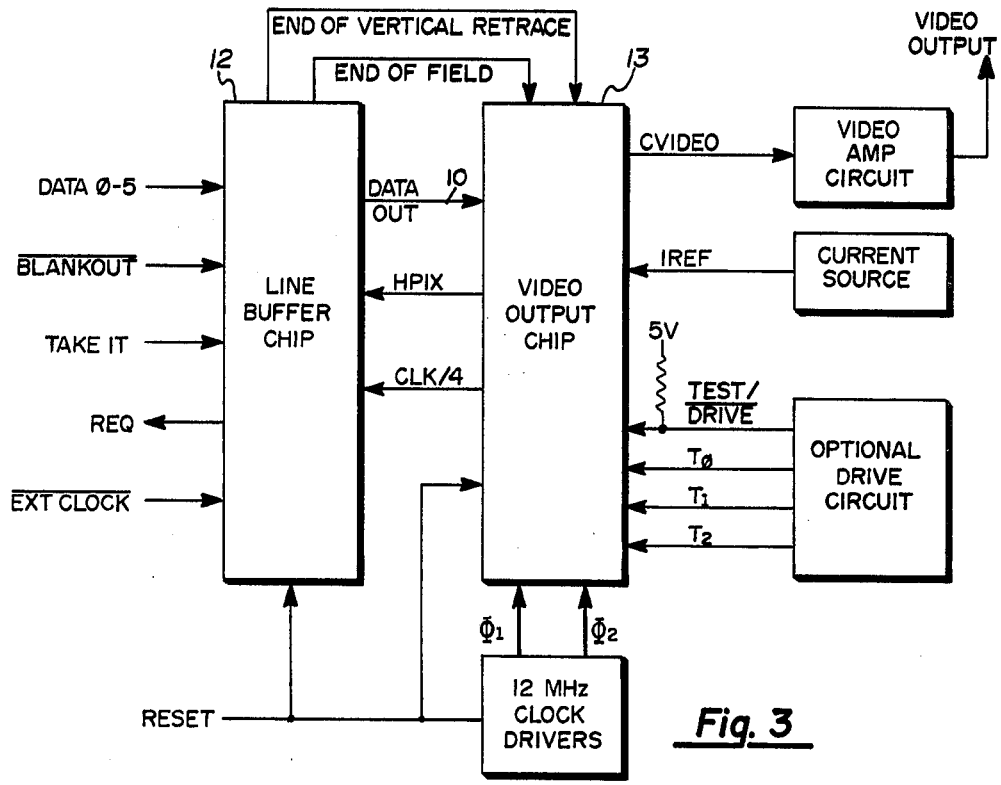
FIG. 3 is a representation of buffer and output circuitry of the system of FIG. 1.

FIG. 3 illustrates the signals that the line buffer circuit and the video output circuit employ to communicate with the rest of the system and with each other. The rate at which the 17 input signals, DATA 1-15, and BLANKOUT are shifted into the circuit is dependent upon both frequency of the external clock and the readiness of the line buffer circuit to accept new data. The readiness is characterized by the state of the REQUEST (REQ) signal. On the output side of the circuit, information is transferred to the video output circuit in 10-bit quantities at a rate exactly equal to the pixel rate divided by four. Synchronization with the video monitor is made possible through the horizontal sync signal HPIX whose main purpose is to bracket the activity part of the video scan line. The RESET line shown in FIG. 3 is common to the whole video system of synchronization during power-up. Finally, two other output leads are assigned to the END FIELD and END OF VERTICAL RETRACE signals.

The storage or line buffers are implemented by two $80 \times 20$ sequentially accessed memories. Each 20-bit word fully describes one of the 80 displayable characters. Eight bits of the character code address the character font of the video output circuit to select one of 256 characters, along with two "Font Select" bits to allow selection of a particular video output circuit. Ten bits of the status (or "highlight") information contribute to the general appearance of the character such as its size, brightness, position relative to the character line, background shade, and so forth.

Given a particular character line, the same sequence of 80 pairs of data is sent to the video output circuit for each scan line. These 160 transfers take place within 160 clock/four periods, and are preceded by a 10-bit row address which specifies which row of the character dot-matrix is to be displayed on the present scan line.

The data must be read from the line buffer a number of times equal to the scan line pairs for that particular character line. At the end of every scan line, the register holding the row address is incremented and points to the next scan to be displayed.

Communication on the input side of the line buffer circuit is attained by two signals, REQUEST and TAKE IT. When the line buffer circuit is empty and can accept a new character, it raises its REQUEST signal and keeps it high until TAKE IT signal goes high, at which time a new set of data on the data input lines is strobed into the line buffer. At this time, the line buffer circuit is able to process that particular character immediately and keeps its REQUEST signal high for another clock period, indicating it can process a second character right away. However, no more than two characters can be processed consecutively. At this time, the line buffer circuit is unable to process another character. This is characterized by the REQUEST signal going low after the second set of data has been strobed in.

Because of the nature of the video signal production, and its need to be compatible with television standards, the output signals of the system must be supplied constantly at the video frequency.

Figure 4:
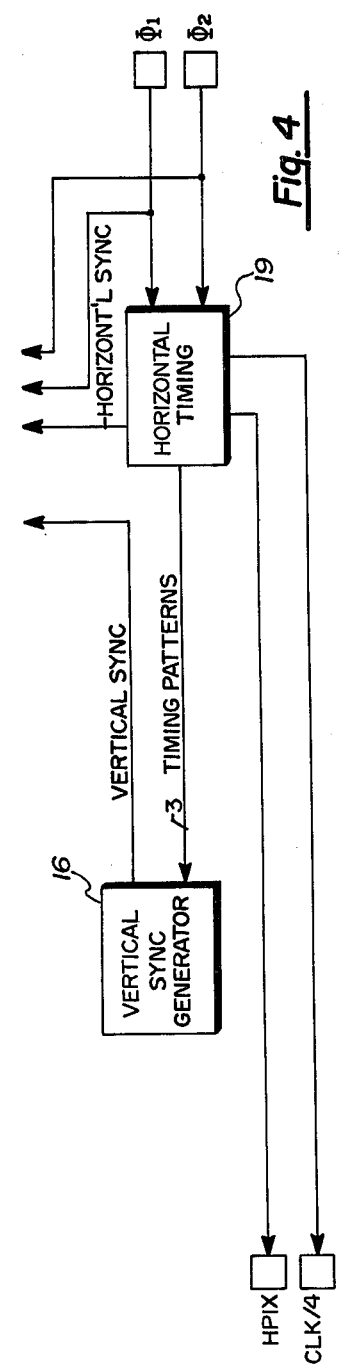
FIG. 4 is a representation of the timing circuitry of FIG. 3.

The video output circuit of FIG. 3 receives data signals that are either a row address, a status code, or a character code which are employed to specify the character to be displayed, the scan line at which the display is to start and various highlights of the display of the character. The synchronization circuitry of FIG. 3 is illustrated in more detail in FIG. 4 and includes the vertical sync generator 16 and horizontal timing circuitry 19. Vertical sync generator 16 examines a row address register. If the two high order bits of the register have been set, vertical sync generator 16 generates the vertical retrace sequence for the timing patterns provided by horizontal timing circuitry 19. In addition, horizontal timing circuitry 19 generates horizontal sync signals for the video output circuit and the respective HPIX and clock/four timing signals for the line buffer circuitry. Horizontal timing circuitry 19 also generates additional signals which are employed by various portions of the video output circuit.

DETAILED DESCRIPTION OF THE INVENTION

The present invention is directed toward a clock generator for the generation of clock signals in a video output circuit or in other integrated circuits which are to operate at clock rates significantly faster than conventional integrated circuits (or require very minimal clock skew) and of the order of 12.3 megahertz and greater. To this end, each integrated circuit is supplied with external clocks and the purpose of the clock generator of the present invention is to translate the high ramp rate of the external clock to the various gates in the integrated circuit and yet to be able to vary the pulsewidth of those internal clock signals as determined by conditions (logic) within the circuit.

To this end, an integrated circuit 20 is illustrated in FIG. 5 in which are implemented one or more clock generators 21A, . . . ,C to drive various gates within the circuit. The respective clock generators are supplied with logic signals L1, L2, L3 . . . which determine the time duration of the respective output clock pulses. The respective clock generators are supplied by a two-phase clock by way of input terminals 22A and B.

As employed in the present invention, the external two-phase clock is made up of two phases $\phi_1$ and $\phi_2$, where $\phi_1$ serves to set the various logic circuitry and $\phi_2$ is employed to provide the output signal therefrom. Again, it is a function of the present invention to employ the high ramp rate of the external clock $\phi_2$ and yet to be able to vary the pulsewidth or time duration of the output clock signal.

A clock generator of the present invention is illustrated in FIG. 6. As shown therein, a logic input signal IN, during clock time $\phi_1$ places FET gates 24 and 27 in a conducting condition where gate 24 along with depletion FET gate 25 form a typical inverter circuit. This causes node ① to rise in voltage, thus conditioning gate 29. With gate 29 in a conducting condition, the capacitance of gate 30 is charged during clock time $\phi_2$. Gates 29 and 30 form a double bootstrap configuration where gate 30 has a larger area configuration and a larger capacitance and it is gate 30 which drives the output signal during time $\phi_2$. Because of the smaller capacitance of gate 29, it is more quickly discharged when clock $\phi_2$ goes low and, therefore, gate 30 is turned off before the output can discharge. With the circuit of the present invention, the output signal is not allowed to go low until the logic IN signal to gate 23 goes low due to the dynamic latch action of gates 24, 25, 26 and 27. Gate 33 serves as a resistor to prevent leakage during the time when phase $\phi_2$ is low. This output signal will remain high until such time as the logic IN signal to gate 23 is no longer present during a subsequent phase $\phi_1$. Gates 31 and 32 are pull-down devices which are turned on during phase $\phi_2$ when the logic IN is low.

It should be noted in FIG. 6 that gates 25 and 33 are depletion transistors while gates 27, 29, and 30 are control enhancement transistors. That is to say, they are formed by an implantation technique so as to have a lower threshold value and, therefore, a faster turn-on characteristic. While the preferred embodiment of the present invention employs such controlled enhancement devices, the circuit of the present invention can be constructed out of only standard enhancement and depletion devices.

For the purposes of clarity, FIG. 7 is a set of waveforms which more clearly illustrate the relation between the output signal and the two external clock signals as determined by the logic IN signal in FIG. 6. As illustrated therein, an output signal is generated with the beginning of the $\phi_2$ clock signal, but only when the circuit has received a logic IN signal during or prior to the $\phi_1$ clock signal. The output signal remains high until the IN signal goes low.

FIG. 8 is a more detailed illustration of the waveforms. The circuit is not set by clock $\phi_1$ until such time as there is a logic IN signal. When the next clock $\phi_1$ reaches its high level, node ② (see FIG. 6) drops to a low value while node ① rises to a high value, thus setting the circuit for output during the next clock $\phi_2$. At that time, there is an output signal rise with the same ramp rate as the $\phi_2$ clock signal and the pulsewidth of this output signal will be determined by the duration of the logic IN signal.

The above-described gated clock circuit provides a number of advantages over prior art gated clock circuits. In the first place there is very little delay between the clock input and the clock ouptut due to the logic circuitry of the clock generator. Such delay is minimized due to the fact that the output drive transistor 30 is a very low impedance transistor and its pulsewidth can be completely variable by the circuit of the present invention. Furthermore, output transistor 30, because of its characteristics, is able to drive a large output capacitance and a large load in a very short amount of time. The clock generator of the present invention is capable to providing an output signal with a rise time of less than 10 nanoseconds. This is accomplished by the double bootstrap arrangements of gates 30 and 29 where gate 29 will have a very low capacitance relative to the capacitance of the output circuitry.

With the present invention one can have a number of different clocks in an integrated circuit running at very high speeds, which circuits are nevertheless driven by a single master clock outside of the circuit and yet can maintain the high clock rise rate of the external clock and still generate internal clock signals of different pulsewidths. Clock skew between circuits thusly can be minimized, thereby allowing higher frequency operation.

EPILOGUE

A variable pulsewidth gated clock generator has been described above which is able to provide output clock signals with the same rise rate as an external driving clock with the output signal being varied in duration according to logic conditions within the integrated circuit. The circuit of the present invention as disclosed includes a latch which is set by the first phase of a two-phase clock to set the internal logic of the circuit to generate a large output signal during the second phase of the two-phase clock.

While but one embodiment of the present invention has been described, it will be apparent to those skilled in the art that variations and modifications may be made therein without departing from the spirit and the scope of the invention as claimed.

What is claimed is:

1. A circuit apparatus for generating a variable pulsewidth high ramp rate output signal in response to a pair of complementary clock signals and a logic signal, said generator comprising:
   a first transistor means disposed for gating therethrough said logic signal in response to a first of said pair of clock signals;
   latch circuit means having an input terminal coupled to said first transistor means and having an output terminal;
   second transistor means having a gate terminal coupled to said output terminal of said latch circuit means and a first signal terminal coupled to a second of said pair of clock signals;
   third transistor means having a gate terminal coupled to the second signal terminal of said second transistor, a first signal terminal coupled to said second of said pair of clock signals and a second signal terminal coupled to an output terminal of said circuit apparatus, such that the ramp rate of said output signal is equal to the ramp rate of said second of said pair of clock signals.

2. A circuit apparatus as in claim 1 further characterized by said second transistor means having a relatively small capacitance for providing a first switching characteristic.

3. A circuit apparatus as in claim 1 further characterized by said third transistor means having a relatively large capacitance for providing said output signal.

* * * * *